United States Patent
Rajamani et al.

(10) Patent No.: US 9,262,350 B2
(45) Date of Patent: Feb. 16, 2016

(54) DE-INTERLEAVING ON AN AS-NEEDED BASIS

(71) Applicant: Intel Corporation, Santa Clara, CA (US)

(72) Inventors: Kannan Rajamani, Edison, NJ (US); Ramon Sanchez, Madrid (ES); Kevin R. Kinney, Coopersburg, PA (US)

(73) Assignee: Intel Corporation, Santa Clara, CA (US)

( * ) Notice: Subject to any disclaimer, the term of this patent is extended or adjusted under 35 U.S.C. 154(b) by 151 days.

(21) Appl. No.: 14/052,911

(22) Filed: Oct. 14, 2013

(65) Prior Publication Data
US 2015/0106577 A1 Apr. 16, 2015

(51) Int. Cl.
*G06F 13/16* (2006.01)
*H03M 13/27* (2006.01)
*H04L 1/00* (2006.01)

(52) U.S. Cl.
CPC .......... *G06F 13/1647* (2013.01); *H03M 13/27* (2013.01); *H04L 1/0071* (2013.01)

(58) Field of Classification Search
None
See application file for complete search history.

(56) References Cited

U.S. PATENT DOCUMENTS

| | | | |
|---|---|---|---|
| 5,502,696 | A | 3/1996 | Yoon et al. |
| 8,179,775 | B2 * | 5/2012 | Chen et al. .................. 370/203 |
| 8,265,206 | B2 * | 9/2012 | Mukai .................. H04L 1/0048 375/341 |
| 8,614,977 | B2 * | 12/2013 | Wu et al. ........................ 370/328 |
| 2006/0236045 | A1 | 10/2006 | Keyes, Jr. |
| 2009/0274248 | A1 * | 11/2009 | Hepler .............. H03M 13/2739 375/341 |

FOREIGN PATENT DOCUMENTS

KR    1300526 B1 * 9/2013

OTHER PUBLICATIONS

Machine translation of KR 1300526 B1.*
John Wiley and Sons, Ltd., edited by Harri Holma and Antti Toskala, "LTE for UMTS—OFDMA and SC-FDMA Based Radio Access," 2009, pp. 118 and 119.
"3rd Generation Partnership Project; Technical Specification Group Radio Access Network; Evolved Universal Terrestrial Radio Access (E-UTRA)," 3GPP (3rd Generation Partnership Project) TS 36.212 V11.2.0 (Feb. 2013) Technical Specification.
John Wiley and Sons, Ltd., Fischer, P., et al., "LTE—The UMTS Long Term Evaluation: From Theory to Practice," 2009, pp. 79-110.

* cited by examiner

*Primary Examiner* — Howard Williams
(74) *Attorney, Agent, or Firm* — Nicholson De Vos Webster & Elliott LLP

(57) ABSTRACT

One embodiment is an apparatus having a memory, a controller, and a de-interleaving module. The memory is configured to store portions of a set of interleaved values, where the set of interleaved values correspond to a single application of an interleaving mapping to a set of un-interleaved values. The controller is configured to retrieve each portion from an other memory that stores the set of interleaved values by moving the portion from the other memory to the memory. The de-interleaving module is configured to de-interleave the interleaved values in at least one of the portions to generate a de-interleaved portion such that processing downstream of the de-interleaving module can begin processing the de-interleaved portion before all of the interleaved values in the set of interleaved values are de-interleaved by the de-interleaving module.

14 Claims, 5 Drawing Sheets

| TABLE I: INTERLEAVED TUPLES OF BLOCK 300 ||
|---|---|
| GROUP | TUPLE |
| 1 | T1 |
| | T13 |
| | T25 |
| | T37 |
| | ⋮ |
| | T708 |
| 2 | T2 |
| | T14 |
| | T26 |
| | T38 |
| | ⋮ |
| | T709 |
| 3 | T3 |
| | T15 |
| | T27 |
| | T39 |
| | ⋮ |
| | T710 |

T1 through T708: $L=60$

⋮

| 12 | T12 |
|---|---|
| | T24 |
| | T36 |
| | T48 |
| | ⋮ |
| | T720 |

FIG. 3

| TABLE II: FIRST TWO PORTIONS OF BLOCK 300 ||
|---|---|
| Portion | TUPLE |
| 1 | T1, T13, T25 |
| | T2, T14, T26 |
| | T3, T15, T27 |
| | ⋮ |
| | T12, T24, T36 |
| 2 | T37, T49, T61 |
| | T38, T50, T62 |
| | T39, T51, T63 |
| | ⋮ |
| | T48, T60, T72 |

FIG. 5

DE-INTERLEAVING ON AN AS-NEEDED BASIS

FIELD OF INVENTION

The present invention relates to signal processing, and, more specifically but not exclusively, to interleaving and de-interleaving of information streams in signal processing systems.

BACKGROUND

In some signal processing systems, the transmission of an information stream over a transmission channel to a receiver can result in burst errors. A burst error occurs when most, if not all, of the values in a contiguous sequence of values of the information stream are in error. If the number of contiguous values in error exceeds the receiver's ability to correct the errors (e.g., using error-correction encoding and decoding), then the receiver will fail to correctly recover the information stream.

To reduce the effects that burst errors have on recovering an information stream at a receiver, many signal processing systems employ interleaving schemes. In such schemes, a transmitter divides the information stream into sets of contiguous values. Each set of contiguous values is input to an interleaver that shuffles the values in the set to generate a set of interleaved values. In so doing, the interleaver applies a single mapping of interleaver inputs to interleaver outputs to each set. Each set of interleaved values is transmitted to the receiver, and, upon receipt of the set of interleaved values, the receiver de-interleaves the set of interleaved values to return the set to its pre-interleaved arrangement. The de-interleaving spreads out any burst errors that were introduced into the sets of interleaved values over the transmission channel, thereby creating a more uniform distribution of errors, which may then be easier to correct using a suitable error correction scheme.

SUMMARY

One embodiment of the disclosure is an apparatus comprising memory, a controller, and a de-interleaving module. The memory is configured to store portions of a set of interleaved values, wherein the set of interleaved values correspond to a single application of an interleaving mapping to a set of un-interleaved values. The controller is configured to retrieve each portion from an other memory that stores the set of interleaved values by moving the portion from the other memory to the memory. The de-interleaving module is configured to de-interleave the interleaved values in at least one of the portions to generate a de-interleaved portion such that a processing module downstream of the de-interleaving module can begin processing the de-interleaved portion before all of the interleaved values in the set of interleaved values are de-interleaved by the de-interleaving module. Additional embodiments of the disclosure as described in this specification, including in the claims.

BRIEF DESCRIPTION OF THE FIGURES

Embodiments of the disclosure will become more fully apparent from the following detailed description, the appended claims, and the accompanying drawings in which like reference numerals identify similar or identical elements.

FIG. 3 shows Table I, which illustrates an exemplary interleaved arrangement of descrambled soft-output values for a block of information;

FIG. 5 shows Table II, which illustrates two exemplary portions of the block of FIG. 3.

WRITTEN DESCRIPTION

Figure 1:
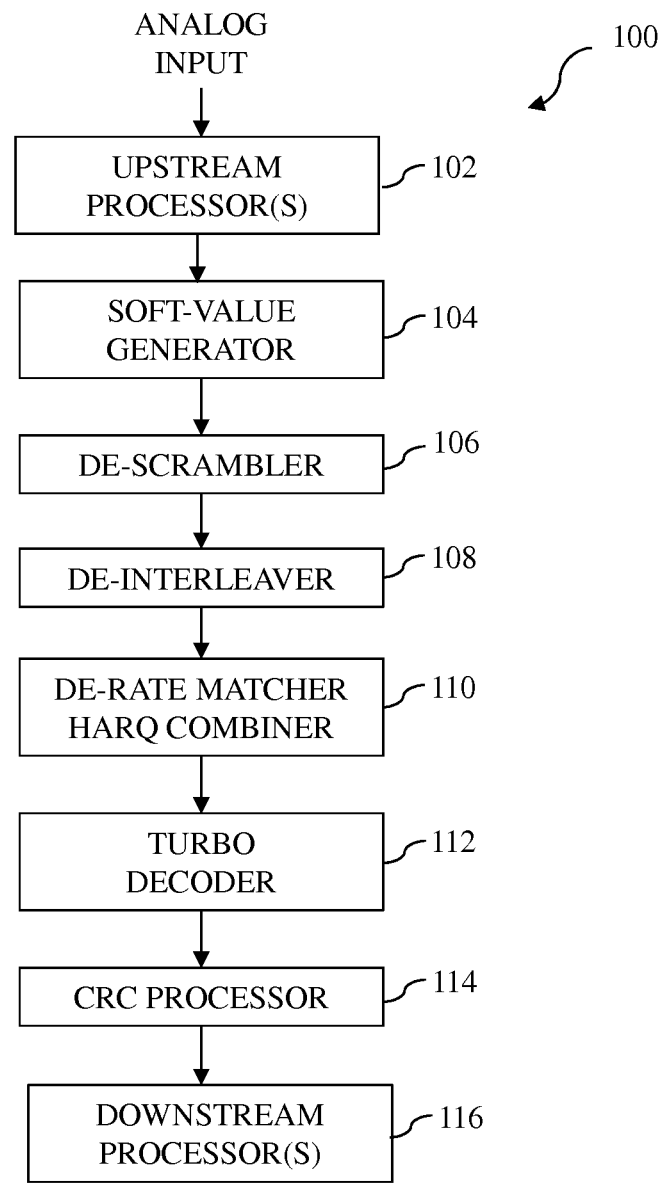
FIG. 1 shows a simplified block diagram of an exemplary base-station receiver according to one embodiment of the disclosure that performs de-interleaving on an as-needed basis.

Reference herein to "one embodiment" or "an embodiment" means that a particular feature, structure, or characteristic described in connection with the embodiment can be included in at least one embodiment of the disclosure. The appearances of the phrase "in one embodiment" in various places in the specification are not necessarily all referring to the same embodiment, nor are separate or alternative embodiments necessarily mutually exclusive of other embodiments. The same applies to the term "implementation."

The following acronyms are used herein:
3GPP $3^{rd}$ Generation Partnership Project
ACK Acknowledgement Message
AGC Automatic Gain Control
ASIC Application-Specific Integrated Circuit
BPSK Binary Phase-Shift Keying
CD Compact Disk
CQI Channel Quality Indicator
CRC Cyclic Redundancy Check
DC Direct Current
DMA Direct Memory Access
DSP Digital Signal Processor
FFT Fast Fourier Transform
FPGA Field-Programmable Gate Array
HARQ hybrid automatic-repeat request
IDFT Inverse Discrete Fourier Transform
LDPC Low-Density Parity Check
LLR Log-Likelihood Ratio
NACK Negative Acknowledgement Message
OFDM Orthogonal Frequency Division Multiplexing
PMI Pre-Coding Matrix Indicator
PUSCH Physical Uplink Shared Channel
QAM Quadrature Amplitude Modulation
QPSK Quadrature Phase-Shift Keying
RAM Random-Access Memory
RI Rank Indicator In a conventional communication system that employs interleaving and de-interleaving, the de-interleaver in the receiver de-interleaves an entire set of interleaved information before processing downstream of the de-interleaver is initiated for the set. As the set of information is de-interleaved, the de-interleaved information is stored in memory. Once the entire set has been de-interleaved and stored in memory, processing downstream of the de-interleaver is initiated. Note that, as used herein, the phrases "set of interleaved values," "set of interleaved information," and variations thereof each refer to a set in which a single mapping of inputs to outputs has been applied by the interleaver at the transmitter.

De-interleaving in this manner results in the initiation of downstream processing being delayed as the downstream processing waits for the entire set to be de-interleaved. However, some forms of downstream processing do not need an entire set of de-interleaved information to begin processing. Rather, some forms of downstream processing can begin processing de-interleaved portions of a set of information as soon as the portions become available, if the portions are provided in an order needed by the downstream processing.

For example, in base-station transceivers that adhere to 3GPP standards, downstream processing such as de-rate matching and HARQ combining can be initiated on de-interleaved portions of information as the de-interleaved portions become available, rather than wait for an entire set of interleaved information to be de-interleaved.

As another example, some sets of interleaved information may have more than one forward-error correction encoded codeword. For such sets, forward error-correction decoding downstream of the de-interleaver can begin decoding the codewords as soon as they are de-interleaved, rather than waiting for all of the codwords in the set of interleaved information to be de-interleaved.

To reduce the latency caused by de-interleavers in conventional signal processing systems, de-interleavers may be envisioned that are capable of de-interleaving sets of interleaved information in portions as the portions are needed (i.e., on an as-needed basis) for processing downstream of the de-interleavers. As these de-interleavers de-interleave subsequent portions of a set of interleaved information, previously de-interleaved portions of the set may be moved from memory to the downstream processing. Thus, receivers implementing such de-interleavers may employ smaller memories that store only portions of an entire set of de-interleaved information, rather than the entire set of de-interleaved information.

FIG. 1 shows a simplified functional block diagram of an exemplary 3GPP base-station receiver 100 according to one embodiment of the disclosure that performs de-interleaving on an as-needed basis. Receiver 100 receives an analog signal comprising blocks of information from one or more users (e.g., one or more mobile devices). Each block of information contains PUSCH data, PUSCH pilots, an ACK/NACK message, an RI, and a CQI/PMI.

Figure 2:
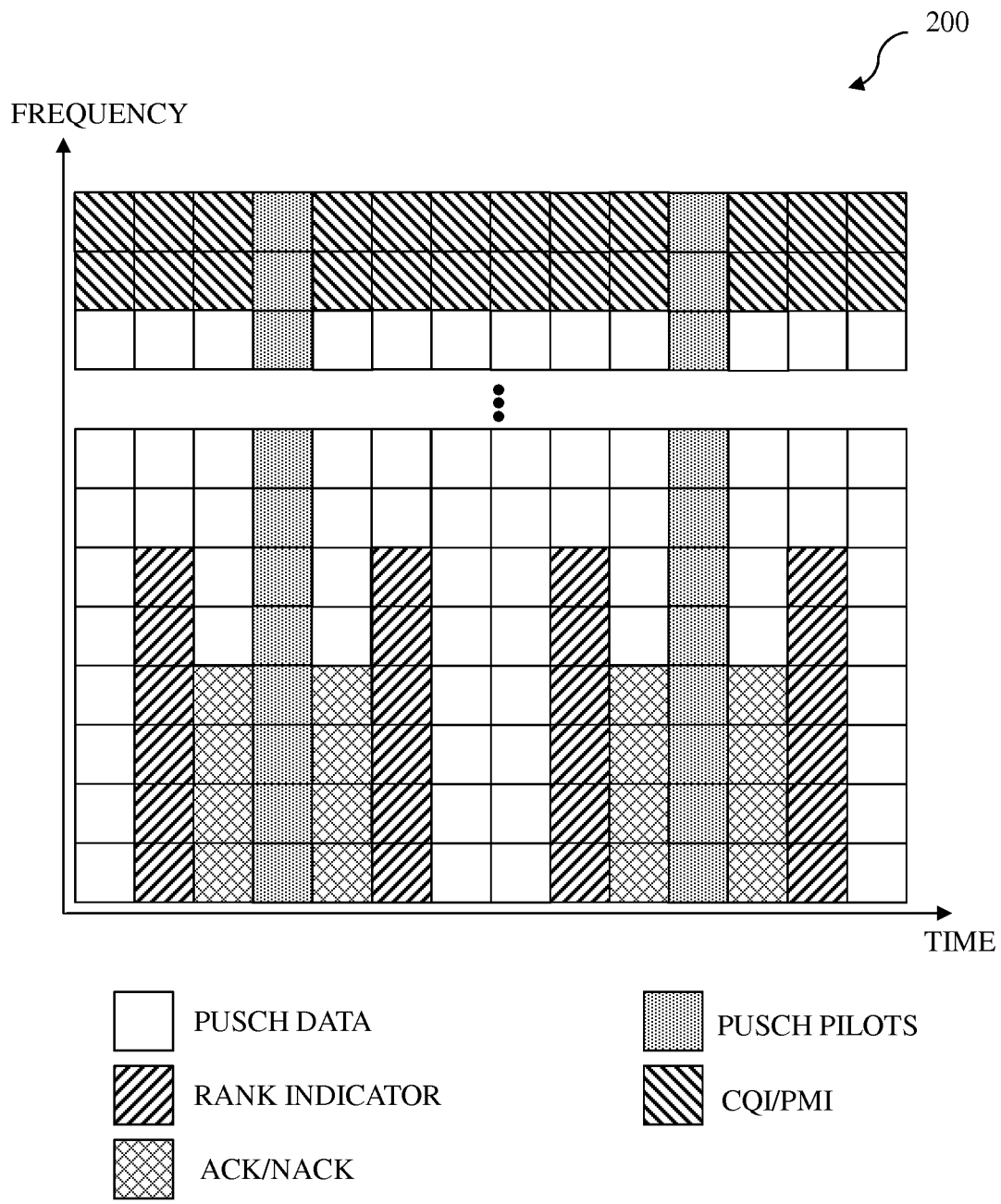
FIG. 2 shows a graphical representation of an exemplary block of information that may be generated at a mobile device and transmitted to the receiver of FIG. 1.

FIG. 2 shows a graphical representation of an exemplary block 200 of information that may be generated at a mobile device and transmitted to receiver 100. Each column represents a different OFDM symbol transmitted at a time t, and each row represents a different sub-carrier frequency of the OFDM symbols. Each sub-carrier frequency in each OFDM symbol (i.e., each element in block 200) is modulated with information using a suitable modulation scheme. For example, each subcarrier may be modulated with one bit using BPSK, two bits using QPSK, or four bits using 16-QAM.

The information used to modulate each sub-carrier frequency in each OFDM symbol corresponds to one of: (i) the PUSCH data, (ii) the PUSCH pilots, (iii) the ACK/NACK message, (iii) the RI, and (iv) the CQI/PMI. The PUSCH data in block 200 may contain one or more codewords that are encoded at the transmitter using a forward error-correction code such as (without limitation) a turbo code.

Referring back to FIG. 1, the processing of each block is as follows. Each block of information is processed by one or more upstream processors 102, which may include (without limitation) analog-to-digital conversion, de-rotation of time-domain samples, DC-offset removal, AGC, cyclic-prefix removal, FFT processing to convert the time-domain information into a frequency domain, equalization, and IDFT processing to convert the frequency domain information back into the time domain. Note that, although not shown, receiver 100 may also include processing that de-maps blocks sent from different users (i.e., mobile devices), wherein the de-mapped blocks are processed separately for each user.

The output of the one or more upstream processors 102 is a time-domain information stream, wherein the bits of the OFDM symbols are arranged end to end. In other words, the bits are arranged in order such that the bits of the first to last frequencies of the first OFDM symbol in FIG. 2 are followed by the bits of the first to last frequencies of the second OFDM symbol, which are followed by bits of the first to last frequencies of the third OFDM symbol, and so on. Note, however, that the bits of the PUSCH pilots and the CQI/PMI shown in FIG. 2 are removed by upstream processing 102.

A soft-value generator 104, such as a soft-output equalizer or soft-output constellation decoder, generates a soft-output value (e.g., LLR value) for each bit of the time-domain information stream, and descrambler 106 descrambles the soft-output values. Each soft-output value comprises a hard-decision bit and a multi-bit confidence value, and each soft-output value corresponds to a bit of one of (i) the PUSCH data, (ii) the ACK/NACK message, and (iii) the RI. Further, the soft-output values output from descrambler 106 are arranged in an order (i.e., an interleaved order) that was set by an interleaver in the mobile device before being transmitted to base-station receiver 100.

As will be described in further detail below, de-interleaver 108 performs de-interleaving on sets of interleaved values output from descrambler 106. In some embodiments, the blocks processed by base-station receiver 100 each contain only one set of interleaved values, while in other embodiments, the blocks each contain more than one set of interleaved values. In the latter embodiments, the blocks could contain more than one forward-error-correction encoded codeword, where each codeword is separately interleaved.

For each set of interleaved values, de-interleaver 108 de-interleaves portions of the set at a time as the portions are needed for de-rate matching and HARQ combining 110. De-rate matcher and HARQ combiner 110 initiates de-rate matching and HARQ combining on the portions of the set as they are de-interleaved, without waiting for the entire set of interleaved values to be de-interleaved. For HARQ combining, multiple copies of a block may be transmitted from the mobile device to base-station receiver 100. HARQ combining 110 generates improved (i.e., more reliable) soft-output values by combining the soft-output values of the multiple copies of the block.

De-rate matcher and HARQ combiner 110 outputs a stream of soft-output values to turbo decoder 112, where each soft-output value corresponds to a bit of a forward-error correction encoded codeword. Turbo decoder 112 decodes one or more codewords in the stream of soft-output values using a forward error-correction decoding technique (e.g., turbo decoding) that corresponds to an encoding technique (e.g., LDPC encoding) used by the mobile device. Note that, if more than one forward-error correction encoded codeword is present in the stream of soft-output values, then turbo decoder 112 may begin processing forward-error correction encoded codewords as they are received, without waiting for all of the forward-error correction encoded codewords to be de-interleaved.

CRC processor 114 performs a CRC on each decoded codeword, and the decoded codeword is processed by one or more downstream processors 116. To further understand the operation of de-interleaver 108 and de-rate matcher and HARQ combiner 110, consider FIGS. 3-5.

FIG. 3 shows Table I, which illustrates an exemplary interleaved arrangement of descrambled soft-output values for a block 300 of information output from descrambler 106. The soft-output values are arranged in tuples (i.e., order sets), where each tuple contains one or more soft-output values, and the arrangement of the tuples is determined by the interleaver of the transmitter of the mobile device. Additionally, each tuple has soft-output values for bits of one of (i) the PUSCH data, (ii) the ACK/NACK message, and (iii) the RI.

In at least some embodiments, the number of soft-output values in each tuple is determined based on the modulation scheme that the mobile device uses to modulate bits of information onto subcarriers of an OFDM symbol. For example, each tuple may contain the soft-output values for one modulated subcarrier of an OFDM symbol, such that each tuple contains, for instance, (i) one soft-output value if the mobile device modulated the subcarriers using BPSK, (ii) two soft-output values if the mobile device modulated the subcarriers using QPSK, and (iii) four soft-output values if the mobile device modulated the subcarriers using 16-QAM.

The 720 tuples are arranged into N=12 groups of tuples, where each group has L=60 tuples, such that tuples T1-T12 are arranged in groups 1-12, respectively, tuples T13-T24 are arranged in groups 1-12, respectively, and so on. As a result of this arrangement, each successive tuple is separated from the previous tuple by L=60 tuples. The object of de-interleaver 108 is to re-arrange the 720 tuples in order from tuple T1 to tuple T720.

Figure 4:
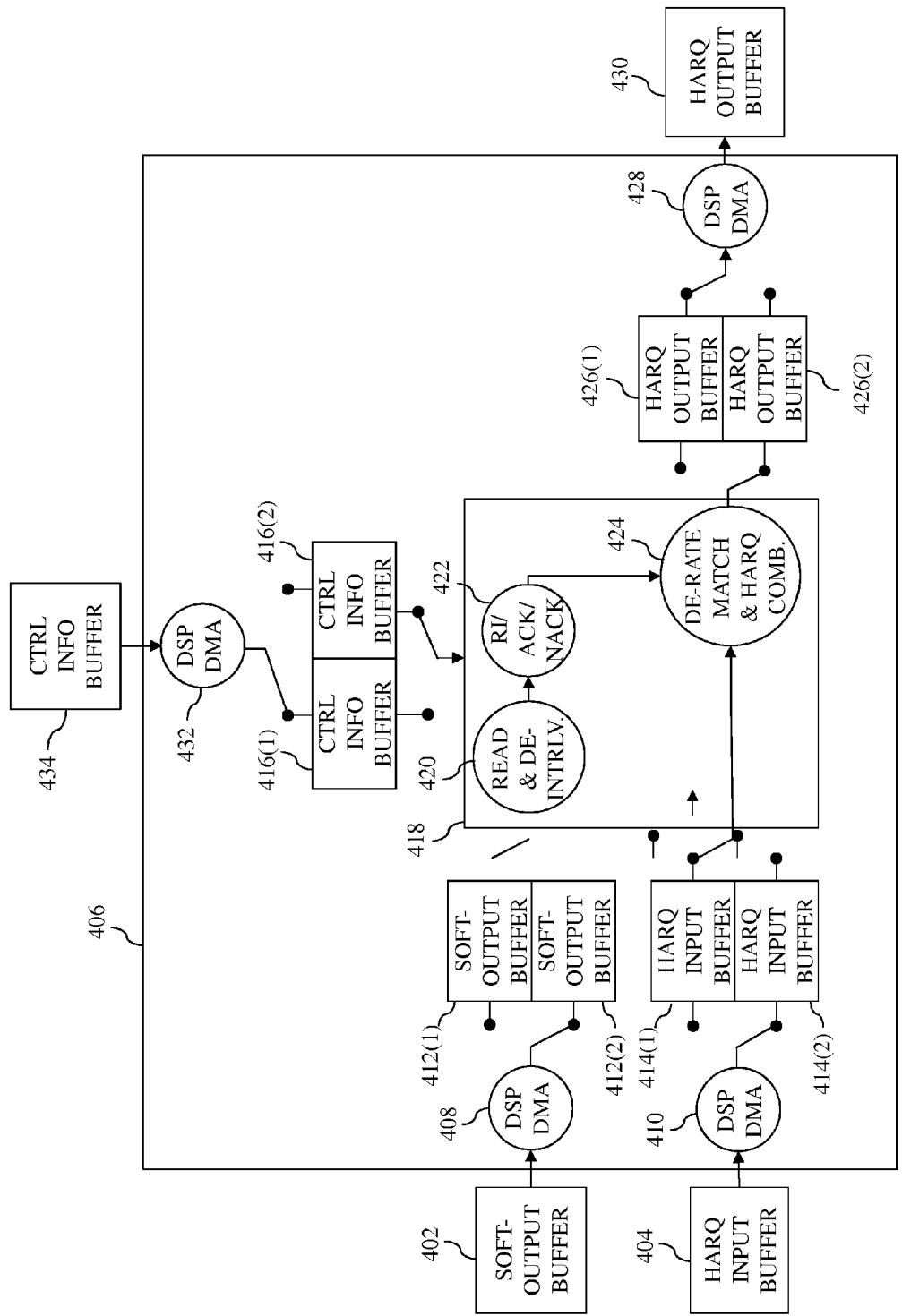
FIG. 4 shows a simplified, but more detailed, block diagram of the de-interleaver, de-rate matcher, and hybrid automatic-repeat request combiner in FIG. 1 according to one embodiment of the disclosure.

FIG. 4 shows a simplified, but more detailed, block diagram of de-interleaver 108 and de-rate matcher and HARQ combiner 110 of FIG. 1 according to one embodiment of the disclosure. Receiver 100 has DSP 406, which may be used to implement de-interleaver 108 and de-rate matcher and HARQ combiner 110 of FIG. 1. Receiver 100 also has a soft-output buffer 402 that stores an entire block of soft-output values output from de-scrambler 106. Soft-output buffer 402 is external to DSP 406 due to the size of the buffer needed to store the entire block of soft-output values. For this discussion, suppose that soft-output buffer 402 stores the block 300 of 720 tuples of soft-output values in the arrangement shown in FIG. 3.

DSP 406 has DMA controller 408 that moves portions of block 300 stored in soft-output buffer 402 to a pair of internal soft-output buffers 412(1) and 412(2) for de-interleaving. Internal soft-output buffers 412(1) and 412(2) may be implemented using, for example, RAM. Further, internal soft-output buffers 412(1) and 412(2) are used in a ping-pong fashion such that one portion of block 300 is written to one of internal soft-output buffers 412(1) and 412(2) while another portion of block 300 is moved from the other one of internal soft-output buffers 412(1) and 412(2) to processing unit 418. Thus, together, internal soft-output buffers 412(1) and 412(2) store at most two portions of block 300, rather than all of block 300.

Each portion of block 300 moved by DMA controller 408 comprises a subset of M tuples from each of the 12 groups of tuples shown in FIG. 3. The subset of M tuples selected from each group shifts by M tuples from one portion to the next. As an example, consider FIG. 5.

FIG. 5 shows Table II, which illustrates two exemplary portions of block 300 that may be moved by DMA controller 408. In this example, M=3. As shown, the first portion of block 300 includes the first three tuples T1, T13, and T25 from group 1, the first three tuples T2, T14, and T26 from group 2, the first three tuples T3, T15, and T27 from group 3, and so on. Further, the second portion of block 300 includes the next three tuples T37, T49, and T61 from group 1, the next three tuples T38, T50, and T62 from group 2, the next three tuples T39, T51, and T63 from group 3, and so on.

Referring back to FIG. 4, processing unit 418 has de-interleaving module 420, which completes the de-interleaving operation for each portion of block 300. In particular, for each portion of block 300 stored in soft-output buffers 412(1) and 412(2), de-interleaving module 420, which may be implemented in software or hardware, performs N=12 reads to read the N=12 subsets of tuples in the portion. As each subsequent subset of the N=12 subsets is read, de-interleaving module 420 de-interleaves the subsequent subset with the previously read subset or subsets. Alternatively, de-interleaving module 420 could read multiple subsets, or even the entire N=12 subsets, before de-interleaving the subsets.

Continuing the example above, de-interleaving module 420 de-interleaves portion 1 of FIG. 5 to arrange the tuples in order from T1 to T36 and portion 2 to arrange the tuples in order from T37 to T72. Once a portion of block 300 is de-interleaved, the soft-output values for the RI and ACK/NACK message are removed by RI/ACK/NACK module 422, which may be implemented using software or hardware. Removal is performed on each portion as it is received without waiting for subsequent de-interleaved portions of block 300.

To support removal of these soft-output values, DSP 406 has control information buffers 416(1) and 416(2), may be implemented using RAM. Control information buffers 416(1) and 416(2) operate in a ping-pong fashion similar to soft-output buffers 412(1) and 412(2) to (i) receive control information from a larger control information buffer 434 that is external to DSP 406 using DMA 432 and (ii) move the control information to RI/ACK/NACK module 422. This control information identifies the location of RI soft-output values and ACK/NACK message soft-output values within each portion so that RI/ACK/NACK module 422 can avoid passing these soft-output values to de-rate matching and HARQ combining module 424. As a result, only soft-output values for the PUSCH data are passed to de-rate matching and HARQ combining module 424.

De-rate matching and HARQ combining module 424, which may also be implemented in software or hardware, performs de-rate matching and HARQ combining on the remaining soft-output values (i.e., the PUSCH data soft-output values). Similar to RI/ACK/NACK module 422, de-rate matching and HARQ combining module 424 performs its operations on each portion of block 300 without waiting for subsequent de-interleaved portions of block 300.

To support HARQ combining, DSP 406 has DMA controller 410, which moves HARQ data from a larger HARQ buffer 404 that is external to DSP 406 to smaller internal HARQ input buffers 414(1) and 414(2), which may be implemented using RAM. The HARQ data is PUSCH data from a previously transmitted copy of block 300 that is used for HARQ combining. Internal HARQ input buffers 414(1) and 414(2) operate in a ping-pong fashion, similar to soft-output buffers 412(1) and 412(2).

The de-rate matched and HARQ combined portions are stored in HARQ output buffers 426(1) and 426(2) in a ping-pong fashion, and moved by DMA controller 428 from HARQ output buffers 426(1) and 426(2) to a larger HARQ output buffer 430 that is external to DSP 406. The soft-output values stored in external HARQ output buffer 430 are subsequently decoded by turbo decoder 112 of FIG. 1. Note that, if block 300 contains more than one forward-error correction encoded codeword, then turbo decoder 112 could initiate decoding on each codeword before it receives subsequent de-interleaved codewords from DSP 406.

In FIG. 4, DSP 406 stores up to two partially de-interleaved portions of a block at a time using soft-output buffers 412(1) and 412(2), and does not store the completed de-interleaved portions output from de-interleaving module 420. Thus, receiver 100 performs de-interleaving using only two memories (i.e., soft-output buffers 412(1) and 412(2)). Since these two memories together store less than an entire block of de-interleaved information, receiver 100 performs de-interleaving using a smaller amount of memory than conventional signal processing systems that store a full block of de-interleaved information.

Although an embodiment of the disclosure has been described relative to its use with a 3GPP receiver, embodiments of the disclosure are not so limited. Alternative embodiments of the disclosure may be implemented in systems that do not employ 3GPP standards. For instance, de-interleavers of the disclosure may be implemented in hard-disk drive systems, wherein the read channel of the hard-disk drive system is the receiver. Such alternative embodiments may implement downstream processing other than removal of the RI and ACK/NACK message, de-rate matching, and HARQ combining. For example, the portions of de-interleaved information could be provided directly to a turbo decoder for decoding. Further, such alternative embodiments may de-interleave sets of information other than blocks of information adhering to the 3GPP standards.

Further, alternative embodiments of the disclosure may de-interleave blocks of data that are interleaved at a transmitter using an interleaving arrangement other than that shown in FIG. 3.

Yet further, alternative embodiments of the disclosure may be implemented using memory that is larger or smaller in size than soft-output buffers 412(1) and 412(2). For example, some embodiments of the disclosure can be implemented using a single soft-output buffer that stores only one portion of the block (e.g., one of soft-output buffers 412(1) and 412(2)). In such embodiments, access to the single soft-output buffer may be time-multiplexed such that each portion of the block is written to and read from the soft-output buffer before another portion of the block is written to and read from the soft-output buffer. As another example, some embodiments of the disclosure can be implemented using memory capable of storing more than two portions of the block at a time.

Yet still further, alternative embodiments of the disclosure can be implemented to de-interleave values other than soft-output values. For example, alternative embodiments may de-interleave values, where each value is a single bit or a plurality of bits.

Although various features of the disclosure were described as being implemented in a DSP, embodiments of the disclosure are not so limited. One skilled in the art would recognize that the various features and functions of DSP 406 may be implemented off chip.

Although embodiments of the disclosure were described as having memories external to DSP 406, embodiments of the disclosure are not so limited. According to alternative embodiments, one or more of memories 402, 404, 430, and 434 may be implemented internal to the DSP. In at least some such alternative embodiments, the respective ping-pong memories may be omitted.

Embodiments of the disclosure may be implemented as circuit-based processes, including possible implementation as a single integrated circuit (such as an ASIC or an FPGA), a multi-chip module, a single card, or a multi-card circuit pack. As would be apparent to one skilled in the art, various functions of circuit elements may also be implemented as processing blocks in a software program. Such software may be employed in, for example, a DSP, micro-controller, or general-purpose computer.

The invention can be embodied in the form of methods and apparatuses for practicing those methods. The invention can also be embodied in the form of program code embodied in tangible media, such as magnetic recording media, optical recording media, solid state memory, floppy diskettes, CD-ROMs, hard drives, or any other non-transitory machine-readable storage medium, wherein, when the program code is loaded into and executed by a machine, such as a computer, the machine becomes an apparatus for practicing the invention. The invention can also be embodied in the form of program code, for example, stored in a non-transitory machine-readable storage medium including being loaded into and/or executed by a machine, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits.

It will be further understood that various changes in the details, materials, and arrangements of the parts which have been described and illustrated in order to explain the nature of this invention may be made by those skilled in the art without departing from the scope of the invention as expressed in the following claims.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

The embodiments covered by the claims in this application are limited to embodiments that (1) are enabled by this specification and (2) correspond to statutory subject matter. Non-enabled embodiments and embodiments that correspond to non-statutory subject matter are explicitly disclaimed even if they fall within the scope of the claims.

What is claimed is:

1. An apparatus comprising:
    memory configured to store portions of a set of interleaved values, wherein the set of interleaved values correspond to a single application of an interleaving mapping to a set of un-interleaved values;
    a controller configured to retrieve each portion from an other memory that stores the set of interleaved values by moving the portion from the other memory to the memory; and
    a de-interleaving module configured to de-interleave the interleaved values in at least one of the portions to generate a de-interleaved portion such that a processing module downstream of the de-interleaving module can begin processing the de-interleaved portion before all of the interleaved values in the set of interleaved values are de-interleaved by the de-interleaving module, wherein the processing module downstream of the de-interleaving module comprises at least one of:

a removal module configured to begin removing at least one of an acknowledgement message, and a negative acknowledgement message from the de-interleaved portion before all of the interleaved values in the set of interleaved values are de-interleaved by the de-interleaving module, a de-rate matching module configured to begin de-rate matching on the de-interleaved portion before all of the interleaved values in the set of interleaved values are de-interleaved by the de-interleaving module; and a hybrid automatic-repeat request module configured to begin hybrid automatic-repeat request combining on the de-interleaved portion before all of the interleaved values in the set of interleaved values are de-interleaved by the de-interleaving module.

2. The apparatus of claim 1, comprising a digital signal processor, wherein the digital signal processor comprises the memory, the controller, and the de-interleaving module.

3. The apparatus of claim 2, wherein the controller is a direct-memory access controller; and the other memory comprises memory external to the digital signal processor.

4. The apparatus of claim 1, wherein the apparatus comprises the removal module, the de-rate matching module, and the hybrid automatic-repeat request module.

5. The apparatus of claim 1, wherein: the interleaved values in the set of interleaved values are arranged into N groups of interleaved values; each portion comprises N subsets of interleaved values, one subset from each of the N groups of interleaved values; and the controller is configured to retrieve, for each portion, the N subsets of interleaved values from the other memory.

6. The apparatus of claim 1, wherein each interleaved value is a tuple comprising one or more elements.

7. The apparatus of claim 6, wherein each element is a soft-output value.

8. The apparatus of claim 6, wherein each tuple comprises information for one modulated symbol modulated using a digital modulation scheme.

9. A method comprising:
(a) retrieving portions of a set of interleaved values from a memory that stores the set of interleaved values, wherein the set of interleaved values correspond to a single application of an interleaving mapping to a set of un-interleaved values;
(b) de-interleaving the interleaved values in at least one of the portions to generate a de-interleaved portion such that processing downstream of the de-interleaving can begin processing the de-interleaved portion before all of the interleaved values in the set of interleaved values are de-interleaved; and
(c) performing the processing downstream of the de-interleaving by at least one of: (c1) removal of at least one of, an acknowledgement message, and a negative acknowledgement message from the de-interleaved portion; (c2) de-rate matching on the de-interleaved portion;
and (c3) hybrid automatic-repeat request combining on the de-interleaved portion.

10. The method of claim 9, wherein step (c) comprises beginning steps (c1)-(c3) before all of the interleaved values in the set of interleaved values are de-interleaved.

11. The method of claim 9, wherein: the interleaved values in the set of interleaved values are arranged into N groups of interleaved values; each portion comprises N subsets of interleaved values, one subset from each of the N groups of interleaved values; and step (c) retrieves, for each portion, the N subsets of interleaved values from the other memory.

12. The method of claim 9, wherein each interleaved value is a tuple comprising one or more elements.

13. The method of claim 12, wherein each element is a soft-output value.

14. The method of claim 12, wherein each tuple comprises information for one modulated symbol modulated using a digital modulation scheme.

\* \* \* \* \*